United States Patent [19]

Mortelmans et al.

[11] 4,165,535
[45] Aug. 21, 1979

[54] BUBBLE MEMORY DRIVE SYSTEM USING A PICTURE FRAME CORE AND A REFLECTION BOX

[75] Inventors: Joost Mortelmans, Campbell; Otto Voegeli, Morgan Hill, both of Calif.

[73] Assignee: International Business Machines Corporation, Armonk, N.Y.

[21] Appl. No.: 838,347

[22] Filed: Sep. 30, 1977

[51] Int. Cl.² .............................................. G11C 19/08
[52] U.S. Cl. ...................................................... 365/2
[58] Field of Search ...................................... 365/2, 53

[56] References Cited

PUBLICATIONS

IBM Technical Disclosure Bulletin—vol. 19, No. 9, Feb. 1977, pp. 3323–3324, 3571–3572.

*Primary Examiner*—James W. Moffitt
*Attorney, Agent, or Firm*—Joseph E. Kieninger

[57] ABSTRACT

A drive system for a bubble memory consists of a drive assembly and an electrically conducting surface enclosing the drive assembly. In a preferred embodiment, the drive assembly consists of a ferrite picture frame with two pairs of drive coils and the conducting surface is the interior surface of a metallic box.

6 Claims, 1 Drawing Figure

BUBBLE MEMORY DRIVE SYSTEM USING A PICTURE FRAME CORE AND A REFLECTION BOX

FIELD OF THE INVENTION

This invention relates to bubble memory packages and more particularly to an improved drive system.

DESCRIPTION OF THE PRIOR ART

Field access bubble memory systems utilize a rotational magnetic drive field to propagate bubble domains. Typically, the most widely used drive field consists of a solenoid coil adapted for the x-direction and a similar type solenoid coil arranged perpendicular thereto for the y-direction such as shown in the prior art section of U.S. Pat. No. 3,952,292. With this arrangement, both of the solenoid coils enclose the chips. As a result, the high voltage on the wires of the coil capacitively induce undesirable noise into the sensors of the chips. Another problem with this type of drive system is that since the wires are completely wrapped around the bubble memory chips, the length of the wire used is relatively long causing the coil to have a high resistance which results in a significant power loss. Another problem with the conventional solenoid coil drive system is that the heat is produced over a surface which completely encloses the chips thereby making it difficult to maintain the chips at the ambient temperature.

A modification of the conventional solenoid coil drive system employs flat faced coils together with reflection plates as is shown in the U.S. Pat. No. to Braun, 4,027,300 assigned to the assignee of this invention and in the article entitled "Reflection Coil Packaging for Bubble Devices" in the IEEE Transactions on Magnetics, Vol. MAG-11, No. 5, September, 1975. While improvements are reported with the flat coil approach, the same problems remain to a certain extent.

An entirely different approach involves the use of a ferromagnetic circuit for channeling the drive field to the chip area from drive coils external to the chip area. Such drive systems, employing a ferromagnetic circuit in the form of a soft magnetic ferrite torroid which carries two pairs of drive coils have been utilized in the industry in a bubble chip test apparatus.

The picture frame core has also been considered as a drive system in a bubble memory package. One such system is described in the IBM Technical Disclosure Bulletin, Vol. 19, No. 9, February, 1977, page 3571-2, entitled "Ferrite Pole Drive Structure" which shows a plurality of picture frame core drive systems. This device has a pair of electrically conducting reflection planes above and below the picture frames. These reflection planes are co-planar with the bubble chip surfaces and serve to contain the high frequency magnetic drive field between said reflection planes such that the drive field is spatially uniform and perfectly co-planar with the chip surfaces. It has been found, however, that a picture frame drive system employing a pair of reflection planes is less efficient than the conventional solenoid drive system due to the power loss in the reflection planes. It has been found that the power loss in reflection planes occurs primarily because the finite size of said planes do not provide an adequate low resistance return path for the currents induced in these planes. Use of reflection planes having an area substantially larger than the ferrite frame which would provide an adequate path and have a low power loss is impractical, however, as it increases the size of the bubble memory package.

SUMMARY OF THE INVENTION

It is a primary object of this invention to provide an improved drive system for bubble memories.

It is another object of this invention to provide a bubble drive system having improved spatial field uniformity.

It is yet another object of this invention to provide a picture frame drive system having reduced power loss.

It is still another object of this invention to provide a picture frame drive system having improved efficiency.

It is yet still another object of this invention to provide a bubble drive system with improved heat transfer.

It is a further object of this invention to provide a bubble drive system having low induced noise levels.

These and other objects are accomplished by employing two reflection planes substantially equal in area to the size of the drive assembly and electrical connections being provided between the two planes around their periphery. In a preferred embodiment, the drive assembly is a ferrite picture frame carrying a drive coil on each of its legs and the reflective surface is an electrically conducting box having six sides which completely enclose the frame and the bubble chips.

Other objects of this invention will be apparent from the following detailed description, reference being made to the accompanying drawing wherein a preferred embodiment of the invention is shown.

DESCRIPTION OF THE ILLUSTRATIVE EMBODIMENTS

Figure 1:
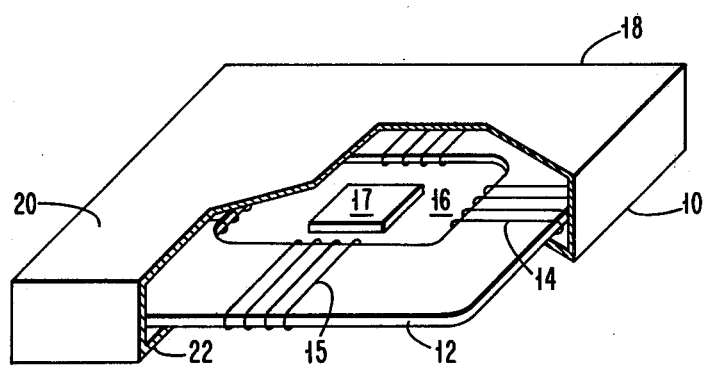
FIG. 1 is a perspective view partially cut away to illustrate a picture frame core enclosed in a reflection box.

This invention is concerned with a drive system for a bubble memory package. The drive system contains a drive assembly and a reflective surface which completely surrounds and encloses the drive assembly. The reflective surface which surrounds the drive assembly reduces the inductance by preventing leakage of flux from the sides of the drive assembly. The reflective surface also reduces the effective resistance of the coil by allowing the two reflection plate currents to flow in a less resistive continuous loop configuration.

In a preferred embodiment, the reflective surface is an electrically conducting box as is shown in FIG. 1. The drive system 10 has a picture frame drive 12 that has a number of turns of wire 14 on two of its legs to form one drive coil and wire 15 on the other two legs to form a second coil. While a picture frame is the preferred drive assembly, it is understood that other drive assemblies such as solenoidal or flat faced drive coils may be used. The drive assembly may consist of a ferromagnetic core circuit through drive coils adapted to channel the drive field to the chip area. The wire 14 is of the wire commonly used for coils. The picture frame 12 is formed of a soft magnetic, low loss, non-conductive material such as a ferrite material. Positioned inside the picture frame 12 in the area 16 are the bubble chips 17.

In accordance with this invention, the picture frame 12 is surrounded and completely enclosed by a reflection surface 18. The reflecting surface 18 is made of an electrically conducting material which has a thickness sufficient to cause the surface to reflect the magnetic field surrounding the picture frame core 12. In a preferred embodiment, the reflecting surface 18 is in the form of a box. The shape of the reflecting surface 18 is not limited to a box shape and it can have a wide variety of shapes as long as it completely encloses the picture frame core 12. The two surfaces 20 and 22 of the reflecting surface 18 must be coplanar in the portions thereof which face the bubble chips in the area 16. It is preferred that the surface 18 surrounding the picture frame 12 and the bubble chips in the area 16 is such as to make the enclosed volume a minimum.

EXAMPLES NO. 1 and NO. 2

A drive system as shown in FIG. 1 having a picture frame drive assembly made of a proprietary ferrite composition (Example No. 1) and a metallic box was tested for its performance characteristics. Example No. 2 had a picture frame made of a commercially available ferrite composition. The picture frame had an outside dimension of 1" and an inside dimension of 0.5". Each side of the frame had 26 turns of Litz wire (15×#41) on it. A current was applied to the picture frame drive assembly to provide a 40 Oe peak drive field.

The performance of these two drive systems were compared to prior art drive system having a picture frame with the same ferrite composition and which had a reflection plate on both sides. The comparative data is set forth below:

| Sample | Ferrite | Heat Generated Watts | Reactive Power, VA |
|---|---|---|---|
| Prior Art | Proprietary | 1.7 | 26.6 |
| Example 1 | Proprietary | 0.9 | 7.8 |
| Prior Art | Commercial | 3.0 | 35.5 |

| Sample | Ferrite | Heat Generated Watts | Reactive Power, VA |
|---|---|---|---|
| Example 2 | Commercial | 0.8 | 7.5 |

The data illustrate that the performance of the drive system is improved by the use of a metallic box because less heat is generated and because less power is required to drive the system.

Although a preferred embodiment of this invention has been described, it is understood that numerous variations may be made in accordance with the principles of this invention.

What is claimed is:

1. A drive system for field accessed bubble memory devices containing at least one bubble chip comprising:
   a drive assembly, and
   a closed electrically conducting enclosure having said drive assembly positioned therein, said enclosure providing circumferentially continuous electrical current paths about said drive assembly to reflect the magnetic drive field surrounding said drive assembly.

2. A drive system as described in claim 1 wherein said enclosure has two portions thereof positioned coplanar with the bubble chip.

3. A drive system as described in claim 1 wherein the drive assembly consists of a ferro-magnetic core circuit through drive coils adapted to channel the drive field to the chip area.

4. A drive system as described in claim 1 wherein the drive assembly is a ferrite picture frame with each leg of said frame passing through one drive coil.

5. A drive system as described in claim 1 wherein said enclosure is in the form of a box.

6. A drive system as described in claim 1 wherein said enclosure is adapted to provide a minimum volume about said drive assembly and bubble chip.

* * * * *